United States Patent
Aoki et al.

(10) Patent No.: US 9,142,477 B2
(45) Date of Patent: Sep. 22, 2015

(54) SEMICONDUCTOR MODULE

(71) Applicant: Kabushiki Kaisha Toshiba, Tokyo (JP)

(72) Inventors: Hideo Aoki, Kanagawa (JP); Chiaki Takubo, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/791,713

(22) Filed: Mar. 8, 2013

(65) Prior Publication Data

US 2014/0252649 A1 Sep. 11, 2014

(51) Int. Cl.
*H01L 23/34* (2006.01)
*H01L 23/36* (2006.01)

(52) U.S. Cl.
CPC .......... *H01L 23/36* (2013.01); *H01L 2924/0002* (2013.01)

(58) Field of Classification Search
CPC .......... H01L 2224/49171; H01L 2224/48145; H01L 25/0657
USPC .................. 257/719, 718, 666, 676; 438/127
See application file for complete search history.

(56) References Cited

U.S. PATENT DOCUMENTS

| | | | | |
|---|---|---|---|---|
| 6,282,095 | B1* | 8/2001 | Houghton et al. | 361/704 |
| 6,303,989 | B1* | 10/2001 | Yasuho et al. | 257/706 |
| 7,345,883 | B2* | 3/2008 | Wakabayashi et al. | 361/714 |
| 7,359,202 | B2* | 4/2008 | Wakabayashi et al. | 361/714 |
| 7,583,505 | B2* | 9/2009 | Wakabayashi et al. | 361/714 |
| 7,804,688 | B2* | 9/2010 | Wakabayashi et al. | 361/714 |
| 8,581,372 | B2* | 11/2013 | Asada et al. | 257/668 |
| 8,838,885 | B2* | 9/2014 | Kwak et al. | 711/103 |
| 2008/0150125 | A1* | 6/2008 | Braunisch et al. | 257/712 |
| 2008/0151487 | A1* | 6/2008 | Ni et al. | 361/684 |
| 2010/0061056 | A1* | 3/2010 | Searls et al. | 361/679.56 |
| 2011/0273834 | A1* | 11/2011 | Moriai et al. | 361/679.32 |
| 2012/0049378 | A1* | 3/2012 | Asada et al. | 257/773 |
| 2012/0317332 | A1* | 12/2012 | Kwak et al. | 711/102 |
| 2013/0186960 | A1* | 7/2013 | Suzuki et al. | 235/492 |
| 2014/0252588 | A1* | 9/2014 | Aoki et al. | 257/713 |

* cited by examiner

*Primary Examiner* — Jaehwan Oh
(74) *Attorney, Agent, or Firm* — Patterson & Sheridan, LLP

(57) ABSTRACT

According to one embodiment, a semiconductor module includes a substrate, which has a first surface and a second surface opposite to the first surface, a controller device and a memory device formed on the first surface, and a metal plate bonded on the second surface. The metal plate is formed at least at a portion of the second surface corresponding to the controller device so that heat generated at the controller device conducts away from the memory device.

4 Claims, 8 Drawing Sheets

SEMICONDUCTOR MODULE

FIELD

Embodiments described herein relate to a semiconductor module.

BACKGROUND

In a semiconductor package or module, heat is generated during operation from memory and controller devices formed on a device substrate which is apart of the semiconductor package or module. The generated heat is transferred by thermal conduction from the device substrate into the substrate of the semiconductor package or module ("packaging substrate") and by convection and radiation from the surface of the packaged device. The generated heat is also, in part, dissipated by conduction from the packaging substrate to the region outside of the module through the electrical contacts between the packaging substrate and a further module or end product and also through columns provided to fix the module to a PC casing or the like, or to a connector of the module.

Now, as high speed operation of the module and high memory capacity of module are desired, the elements on the substrate, such as the memory components and the controller, are preferred to be closely packed and the number of such elements per unit area of the substrate has been increasing. Further, the high speed operation of the controller generates more heat than does a slower operating speed thereof. As a result, the heat generated from the memory components and the controller might not be sufficiently dissipated to the outside of the module, and the quantity of heat held in the semiconductor module, and thus the operating temperature of the module, is increased.

In order to improve the reliability of the memory components and to avoid error in the operation thereof, it is necessary to maintain the temperature of the memory components in or on a substrate as low as possible. This is because as the temperature of the memory components rises, errors in the operation of the memory components occur more frequently. Further, to correct the errors, a tedious operation has to be carried out which slows down the operation of the memory components.

Thus, a semiconductor module that can perform a large capacity memory operation at a high speed and at a low temperature is demanded.

DETAILED DESCRIPTION

In general, according to one embodiment, the present invention provides a semiconductor module having a substrate, which has a first surface and a second surface opposite to the first surface, a controller device and a memory device formed on the first surface, and a metal plate bonded on the second surface. The metal plate is formed at least at the first portion of the second surface corresponding to the controller device so that heat generated by the controller device is conducted away from the memory device.

In the following, embodiments of the present invention will be explained with reference to the drawings.

Here, the drawings are schematic diagrams illustrating the embodiments. The relationship among the various parts with respect to the thickness and width, and the ratio of the sizes between the various portions, may not to the scale. In addition, when the same portion is shown in different drawings, the dimensions and ratios may be different from drawing to drawing. Also, the same numerals are used throughout the specification and drawings of the present patent application, and the features to which they relate will not be explained repeatedly.

(First Embodiment)

Figure 1:
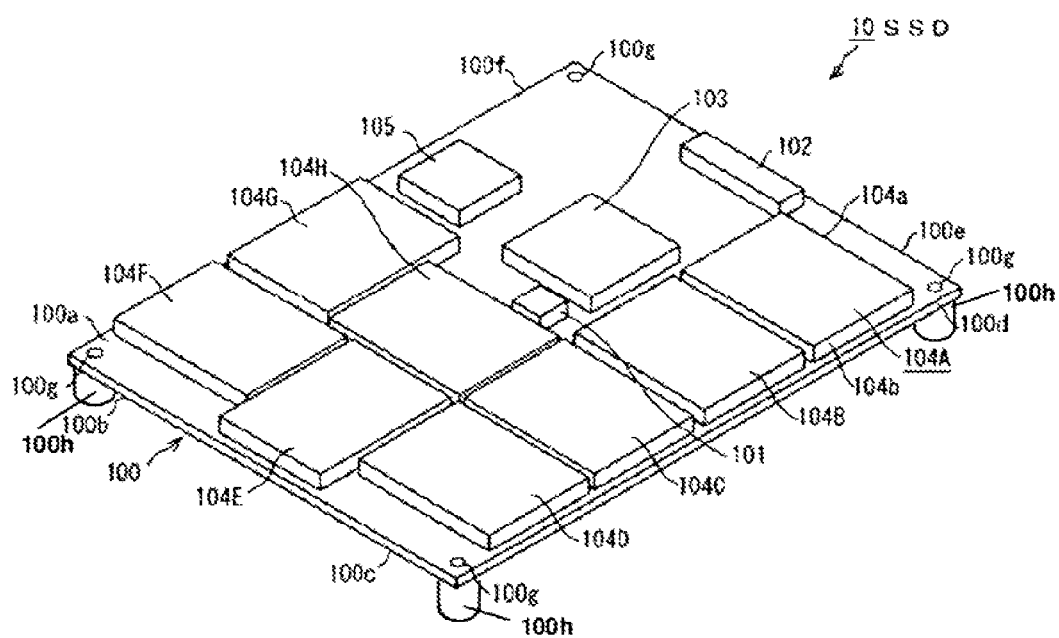
FIG. 1 is a top perspective view illustrating a semiconductor module according to a first embodiment.

FIG. 1 is a top perspective view illustrating a first semiconductor module SSD according to a first embodiment. The first semiconductor module SSD is a memory device using a flash memory as a memory media. The first semiconductor module SSD has a connection interface of the same type as that of a hard disk drive (HDD), and can perform read/write at a high speed, so it can replace or complement the memory capacity of a hard disk drive.

The first semiconductor module SSD includes a packaging substrate 100, a plurality of NAND-type nonvolatile flash memory devices (hereinafter NAND memories) 104A-104H located on, and attached thereto, a DRAM device (hereinafter DRAM) 105 located on, and attached thereto, and a controller device (hereinafter controller 103 located on, and attached thereto. Here, the NAND memories 104A-104H store data and application programs, etc., and, under the control of the controller 103, they carry out read, write, and erasure operations, etc. Consequently, the NAND memories are arranged on the substrate 100 so that the controller 103 is located close to the center of the substrate 100 so that the devices associated therewith are generally located thereabout. The controller 103, in order to carry out processing of the signals input into and output from the controller at a high speed, is arranged near a connector 102, which is explained later. Furthermore, the DRAM 105 works as a cache memory; specifically it works as a cache for data transfer between a host device (not shown in the drawing) and the NAND memories 104A-104H or as an operation region. Consequently, the DRAM 105 is arranged at a position where it can be connected easily to the NAND memories 104A-104H and the controller 103. The packaging substrate 100 includes wiring layers which connect to the controller 103, DRAM 105, NAND memory chips 104A-H and the connecter 102.

The first semiconductor module SDD also has a temperature sensor 101, the connector 102, columns 100h, and through holes 100g. The temperature sensor 101 measures temperature of the substrate 100. The connector 102, which comprises a plurality of wires, is connected to the controller 103 and works as a connecting point for the signals transmitted to and from a location exterior of the semiconductor module, i.e., it provides the input/output bus for the module. The columns 100h are members that protrude from the substrate 100 on the face thereof opposed the location of the controller 103, etc., and provides, support or "standoffs" for the first semiconductor module SSD at the four corners of the substrate 100. Through holes 100g are provided to fix the columns 100h to the substrate 100 by, e.g., screws. The standoffs provide spacing between the underside of the substrate 100 and a structure to which it is to be mounted in use, and also provide a heat conduction pathway between the substrate 100 and an external heat sink (not shown).

Moreover, the first semiconductor module SDD has one or more metal plates 100b-100f (not shown in FIG. 1), which are bonded on the back surface of the substrate 100. The metal plates are disposed to correspond with the portions near the heat generating members arranged on a substrate surface 100a overlying the metal plates, such as the controller 103, and the portions where heat conduction is concentrated, such as the columns 100h and the connector 102. In addition, a metal plate covers the back surface region of the substrate 100 corresponding to the NAND memories 104A-104H. In this case, the metal plates corresponding to the NAND memories 104A-104H are thermally separated from the metal plates 100b-100f corresponding to the controller 103. In the present embodiment, a portion of the metal plates covers the back surface of the substrate 100 corresponding to the position of connector 102 and the vicinity of the columns 100h. The through holes 100g may be of a semicircular shape at the end of the substrate 100.

The metal plates 100b-100f are bonded on the back surface of the substrate 100 by an adhesive resin layer (not shown in FIG. 1). The adhesive resin layer preferably contains metals or inorganic substances with a high thermoconductivity. Alternatively, the adhesive resin layer may formed of a resin alone, in which case the adhesive resin layer is formed with a small thickness. The metal plates 100b-100f preferably have a black color, to facilitate heat dissipation by radiation from the metal plates.

By adopting the above-mentioned structure for the semiconductor module, it is possible to suppress rise in the temperature of the memories 104A-104H as a result of heat transferred thereto from the heat the controller 103. In addition, by providing heat dissipation, i.e., a heat conduction path at the connector 102 and the columns 100h to components remove from the module, it is possible to suppress rise in the temperature of the memories 104A-104H.

(Second Embodiment)

Figure 2A:
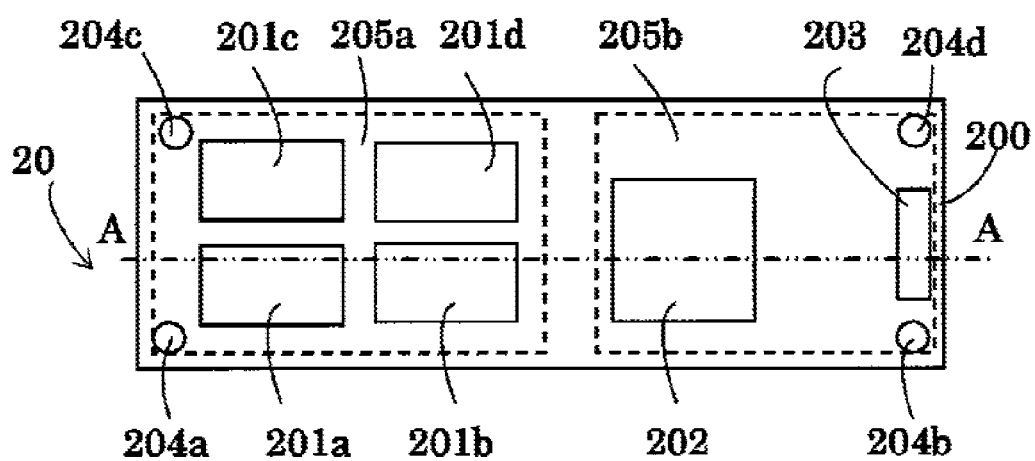
FIG. 2A is a planar view illustrating a semiconductor module according to a second embodiment.
Figure 2B:
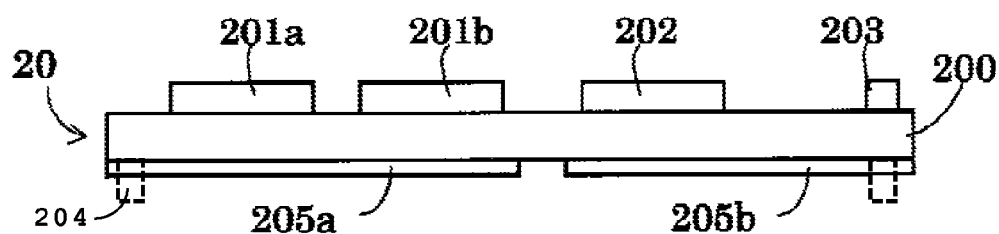
FIG. 2B is a cross-sectional view of the semiconductor module across line A-A in FIG. 2A.

FIG. 2A is a planar view illustrating a second semiconductor module 20 according to second embodiment. FIG. 2B is a cross-sectional view of the semiconductor module 20 across line A-A shown in FIG. 2A. In the following, explanation will be focused on the heat dissipation from the back surface of a substrate in the semiconductor module. The structure of the semiconductor module 20 is shown schematically in FIG. 2A and FIG. 2B.

As shown in FIG. 2A and FIG. 2B, the second semiconductor module 20 has the following elements on a substrate 200: four NAND memories 201a-201d, a controller 202, a connector 203, and columns 204a-204d. The columns 204a-204d are formed at the mounting holes formed at the four corners of the substrate 200. Here, the columns 204a-204d are attached on the substrate so that they protrude downward from the back side of the substrate 200 (not shown in FIG. 2B and see FIG. 1). As the functions of the columns 204a-204d are basically the same as those in the first embodiment, detailed explanation of them will be omitted in this embodiment. The substrate 200 is a printed circuit board in, e.g., a rectangular shape of 9 cm×4 cm.

On the back surface of the substrate 200, metal plates 205a and 205b are bonded to the substrate 200 by an adhesive resin layer (not shown in FIG. 2B). The material of the metal plates 205a and 205b is, for example, copper, with the thickness of, e.g., 0.1 cm. As shown in FIG. 2A, the metal plates 205a and 205b are shown by broken lines. This shows the perimeter of metal plates 205a and 205b bonded on the back surface of the substrate 200 in relation to the positions of the controller 202, connecter 203, column 204 and memory 201. As shown in FIG. 2B, the metal plates 205a and 205b may be extended to the outer peripheral portion of the substrate 200.

One of the metal plates, i.e., the metal plate 205a, is formed to cover the back surface portion of the substrate 200 corresponding to the position of the NAND memories 201a-201d on the front side of the surface and extends into the vicinity of the columns 204a and 204c. The other metal plate 205b is formed to cover the back surface portion of the substrate 200 corresponding to the position of the controller 202, the connector 203, and extend into the area of the columns 204b and 204d. In addition, the metal plate 205a and the metal plate 205b are spaced from each other between the controller 202 and the NAND memories 201b and 201d, i.e., there is a physical gap therebetween.

In the above-mentioned structure, the heat generated by the controller 202 is conducted via the substrate 200 mainly to the metal plate 205b. Here, because there is a space between the metal plate 205b and the metal plate 205a on the memory side, the heat generated at the controller 202 is conducted to the metal plate 205a via the substrate 200, instead of into the metal plate 205b. Because the thermal conductivity of the substrate 200 is 1 or 2 orders of magnitude smaller than that of the metal of the plate 205a, made for example of copper, the heat conducted from the controller 202 to the NAND memories 201a-201d through the substrate 20 is significantly lower than would be if the heat sink on the second side of the substrate extended under both the memory and controller regions of the substrate 20. The heat generated by the controller 202 is conducted to the back side of the connector 203 and the columns 204b and 204d, and the heat is then dissipated to the exterior of the second semiconductor module 20 via the connector 203 and the columns 204b and 204d. The heat generated at the NAND memories 201a to 201d is conducted to the back side of the columns 204a and 204c, and the heat is then dissipated i.e., transferred from the semiconductor module 20 via the columns 204a and 204c to a heat sink.

According to the above-mentioned conduction of heat, the removal or conduction of heat generated by the controller in the second semiconductor module 20 is increased when the module is in operation, by drawing heat generated by the controller 202 away from the memory 201 elements to the exterior of the module 20. As a result, it is possible to prevent or reduce errors in the operation of the NAND memories 201a-201d, which would be otherwise caused by the heat generated at the controller 202.

(Third Embodiment)

Figure 3A:
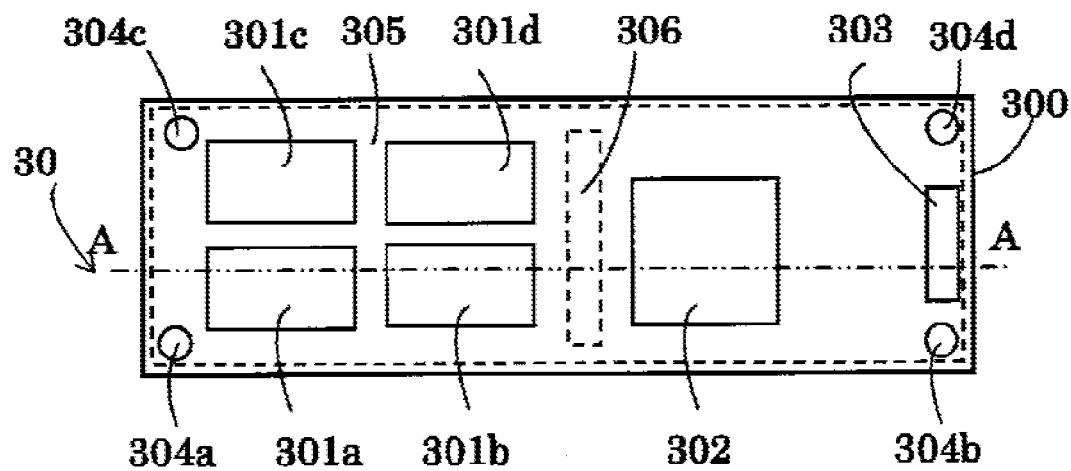
FIG. 3A is a planar view illustrating a semiconductor module according to a third embodiment.
Figure 3B:
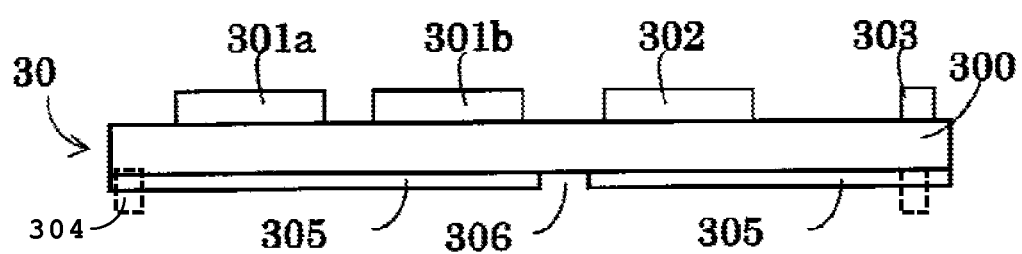
FIG. 3B is a cross-sectional view of the semiconductor module across line A-A in FIG. 3A.

FIG. 3A is a plan view illustrating a third semiconductor module 30 according to a third embodiment. FIG. 3B is a cross-sectional view of the third semiconductor module 30 across line A-A shown in FIG. 3A. The basic structure of the elements formed on a substrate 300 is the same as that of the second semiconductor module 20. However, the shape of the metal plate formed on the back surface of the substrate 300 is different from that in the second embodiment.

As shown in FIGS. 3A and 3B, the third semiconductor module 30 has the following elements in common with the second embodiment located on the substrate 300: four NAND memories 301a-301d, a controller 302, a connector 303, and columns 304a-304d. The columns 304a-304d are formed at the mounting holes that are arranged at the four corners of the substrate 300. In addition, the columns 304a-304d are attached on the substrate 300 so that they protrude downward from the back side of the substrate 300 (not shown in FIG. 3B and see FIG. 1). Here, the functions of the columns 304a-304d are basically the same as corresponding columns in the first and second embodiment, so detailed explanation of them will be omitted in this embodiment. The substrate is, e.g., a printed circuit board with, e.g., a rectangular shape of 9 cm×4 cm.

A metal plate 305 is bonded to the back surface of the substrate 300 by an adhesive resin layer (not shown in FIG. 3B). The material of the metal plate 305 is, for example, copper, and its thickness is, e.g., 0.1 cm. As shown in FIG. 3A, the metal plate 305 is shown by broken lines, showing its position on the back surface of the substrate 300 relative to the components on the front side of the substrate 300. As shown in FIG. 3B, the metal plate 305 may extend to the outer peripheral portion of the substrate 300.

The metal plate 305 is formed to cover (underlie) the portion of the back surface of the substrate 300 corresponding to the four NAND memories 301a to 301d, the controller 302, the connector 303, and the region of the columns 304a-304d. In the metal plate 305, a slit or opening 306 is formed between the portions of the metal plate 305 corresponding to the NAND memories 301a-301d and the controller 302. Consequently, the portion of the metal plate 305 corresponding to the position of the controller 302 is substantially thermally isolated from the portion of the metal plate 305 corresponding to the position of NAND memories 301a-301d by the slit.

In this structure, the heat generated by the controller 302 is conducted via the substrate 300 to the portion of the metal plate 305 directly below the controller 302. Here, because a slit 306 formed in the metal plate 305, the heat conducted from the portions of the metal plate 305 below the controller 302 to the portion below the NAND memories 301a-301d is small The heat generated at the controller 302 is mainly conducted to the columns 304a to 304d and the back side of the connector 303, and the heat is then dissipated via them to an exterior heat sink.

According to the above-mentioned conduction of heat, the heat conduction in the third semiconductor module can be improved when the module is in operation, by drawing heat generated by the controller 302 away from the direction of the memory 301 elements and restricting heat transfer between the controller 302 and memory region by the heat choke effect of the slit 302. As a result, it is possible to prevent error in the operation of the NAND memories 301a-301d, which will be caused by the heat generated at the controller 302.

(Fourth Embodiment)

Figure 4A:
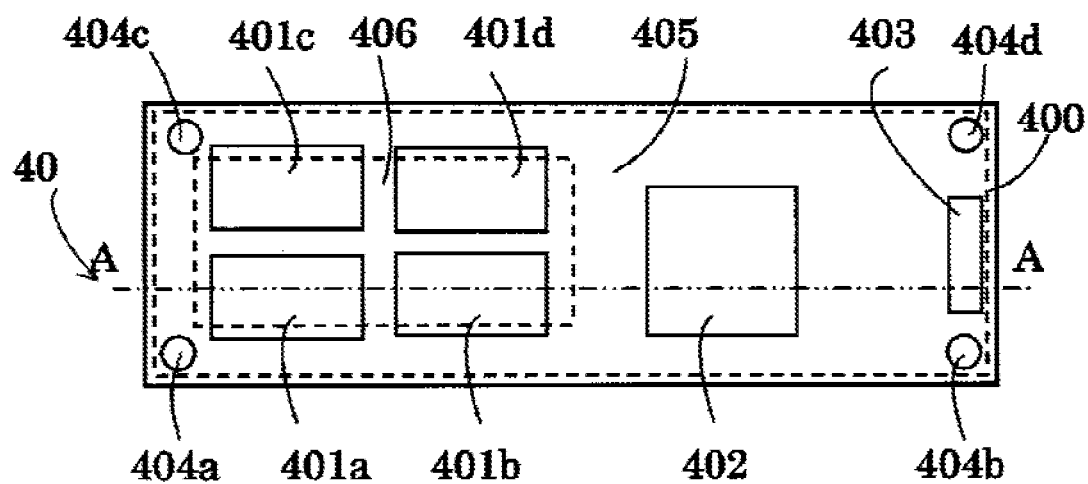
FIG. 4A is a planar view illustrating a semiconductor module according to a fourth embodiment.
Figure 4B:
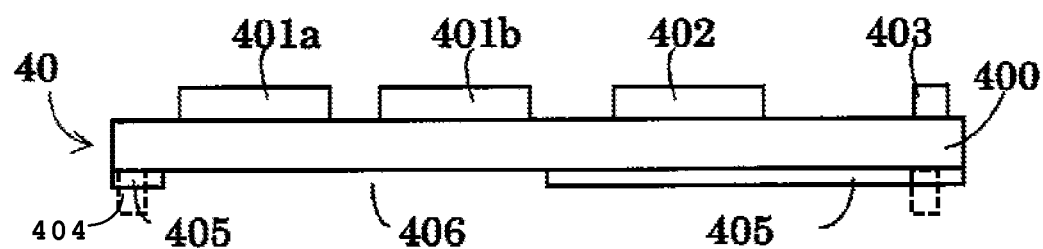
FIG. 4B is a cross-sectional view of the semiconductor module across line A-A in FIG. 4A.

FIG. 4A is a plan view illustrating a fourth semiconductor module 40 according to a fourth embodiment. FIG. 4B is a cross-sectional view of the fourth semiconductor module 40 across line A-A shown in FIG. 4A. The basic structure of the elements formed on a substrate 400 is the same as that of the second semiconductor module 20 according to the second embodiment. However, the shape of the metal plate formed on the back surface of the substrate 400 is different from that in the second embodiment.

As shown in FIGS. 4A and 4B, the fourth semiconductor module 40 has the following elements on the substrate 400: four NAND memories 401a-401d, a controller 402, a connector 403, and columns 404a-404d. The columns 404a-404d are formed at the mounting holes that are formed at the four corners. In addition, the columns 404a-404d are attached on the substrate 400 so that they protrude downward from the back side of the substrate 400 (not shown in FIG. 4B and see FIG. 1). As the functions of the columns 404a-404d are basically the same as those of the first embodiment, detailed explanation of them will be omitted in the description of this embodiment. The substrate 400 is, e.g., a printed circuit board with, e.g., a rectangular shape of 9 cm×4 cm.

A metal plate 405 is bonded to the back surface of the substrate 400 by an adhesive resin layer (not shown in FIG. 4B). The material of the metal plate 405 is, for example, copper, and its thickness is, e.g., 0.1 cm. As shown in FIG. 4A, the metal plate 405 is shown by broken lines. The metal plate 405 is bonded on the back surface of the substrate 400, and its perimeter may extend to the perimeter of the substrate 400, as shown in FIG. 4B.

The metal plate 405 is formed to underlie the portion of the substrate 400 corresponding to a portion of the peripheral region of the four NAND memories 401a-401d, the controller 402, and the connector 403, and the vicinity of the columns 404a-404d. A slit 406, in this embodiment a large generally rectangular void region, is formed from the portion of the metal plate 405 underlying the location of the NAND memories 401b/401d. Consequently, there is minimal conduction path, and thus minimal transfer of the heat generated by the controller 402 to the NAND memories 401a-401d through the metal plate 405.

In the above-mentioned structure, the heat generated by the controller 402 is conducted via the substrate 400 to the portion of the metal plate 405 directly below the controller 402. Here, because the slit 406 is formed in the metal plate 405, the heat conducted from the controller 402 into the metal plate 405 is primarily conducted to the columns 404b, 404d, and as the plate 405 is not present under, or substantially not present under, the area below the NAND memories, minimal transfer of heat from the controller 402 to the memory region of the substrate 400 can occur. Also, the heat generated by the NAND memories 401a-401d is dissipated therefrom via the substrate 400 and a portion of the metal plate 405 and by convection from the upper surface of the NAND memories 401a-401d.

According to the above-mentioned conduction of heat, the heat conduction in the fourth semiconductor module is improved when the module is in operation, by restricting the flow of heat through the plate 405 and into the NAND memories 401a-d. As a result, it is possible to prevent error in the operation of the NAND memories 401a-401d, which will be caused by the heat generated at the controller 402.

(Fifth Embodiment)

Figure 5A:
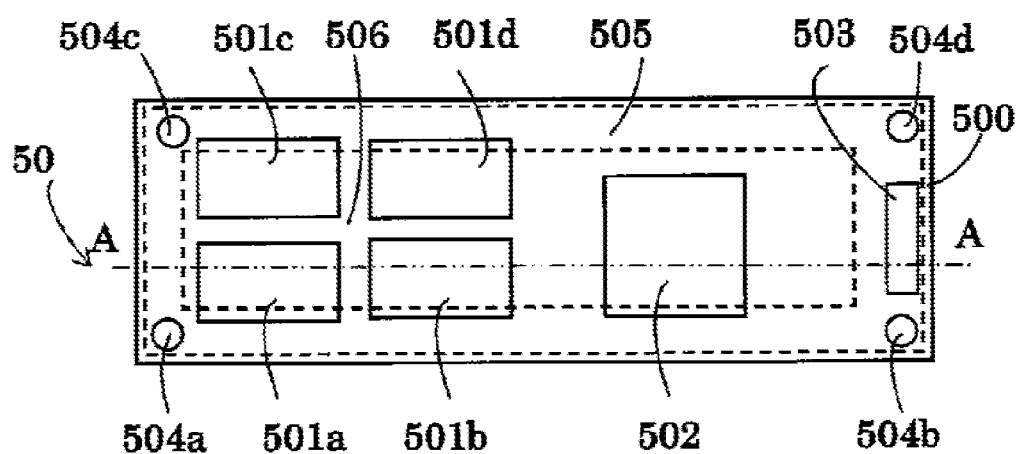
FIG. 5A is a planar view illustrating a semiconductor module according to a fifth embodiment.
Figure 5B:
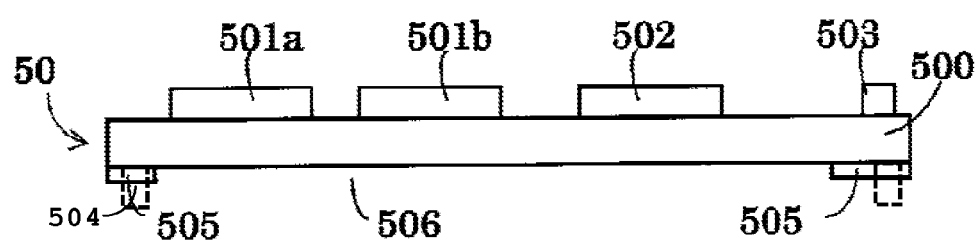
FIG. 5B is a cross-sectional view of the semiconductor module across line A-A in FIG. 5A.

FIG. 5A is a plan view illustrating a fifth semiconductor module 50 according to a fifth embodiment. FIG. 5B is a cross-sectional view of the fifth semiconductor module 50 across line A-A shown in FIG. 5A. The basic structure of the elements formed on a substrate 500 is the same as that of the second semiconductor module 20 according to the second embodiment. However, the shape of the metal plate formed on the back surface of the substrate 500 is different from that in the second embodiment.

As shown in FIGS. 5A and 5B, the fifth semiconductor module 50 has the following elements on the substrate 500: four NAND memories 501a-501d, a controller 502, a connector 503, and columns 504a-504d. The columns 504a-504d are formed at the mounting holes formed at the four corners of the substrate 500. In addition, the columns 504a-504d are attached on the substrate 500 so that they protrude downward from the back side of the substrate 500 (not shown in FIG. 5B and see FIG. 1). As the functions of the columns 504a-504d are basically the same as those of the first embodiment, detailed explanation of them will be omitted in this embodiment. The substrate 500 is, e.g., a printed circuit board with, e.g., a rectangular shape of 9 cm×4 cm.

A metal plate 505 is bonded to the back surface of the substrate 500 by an adhesive resin layer (not shown in the FIG. 5B). The material of the metal plate 505 is, for example, copper, and its thickness is, e.g., 0.1 cm. As shown in FIG. 5A, the metal plate 505 is shown by broken lines, illustrating its position with respect to the components on the upper surface of the substrate 50. As shown in FIG. 5B, the metal plate 505 may extend to the outer peripheral portion of the substrate 500.

The metal plate 505 is formed to cover the portion of the substrate 500 corresponding to a portion of the peripheral region of the four NAND memories 501a-501d, a portion of the peripheral region of the controller 502, and the connector 503, and the vicinity of the columns 504a-504d. A slit or void 506 is formed from the portion of the metal plate 505 between the controller 502 and the connector 503 to the portion of the metal plate 505 between the NAND memories 501a and 501c to the columns 504a and 504c. Because the slit 506 is formed, the heat that would otherwise conduct from a portion of the metal plate 505 below the controller 502 to a portion of the metal plate 505 below the NAND memories 501a-501d is significantly reduced.

In the above-mentioned structure, the heat generated by the controller 502 is conducted via the substrate 500 to the portion of the metal plate 505 below the controller 502. Here, because the slit 506 extends on a portion of the substrate 50 directly below the controller, the heat conducted to the metal plate 505 is primarily conducted to the back side of the connector 503 and the columns 504b and 504d, and the heat is dissipated via them to the exterior of the substrate 50. Because the slit 506 forms a heat choke, the heat conducted in the metal plate 505 is significantly reduced in the direction of the area thereof below the NAND memories 501a-501d. Also, the heat generated by the NAND memories 501a-501d is dissipated by conduction via the substrate 500 and a portion of the metal plate, and by convection from the upper surface of the NAND memories 501a-501d.

According to the above-mentioned conduction of heat, the heat conduction in the fifth semiconductor module into memory region can be reduced when the module is in operation. As a result, it is possible to prevent error in the operation of the NAND memories 501a-501d, which would be caused by the heat generated by the controller 502.

(Sixth Embodiment)

Figure 6A:
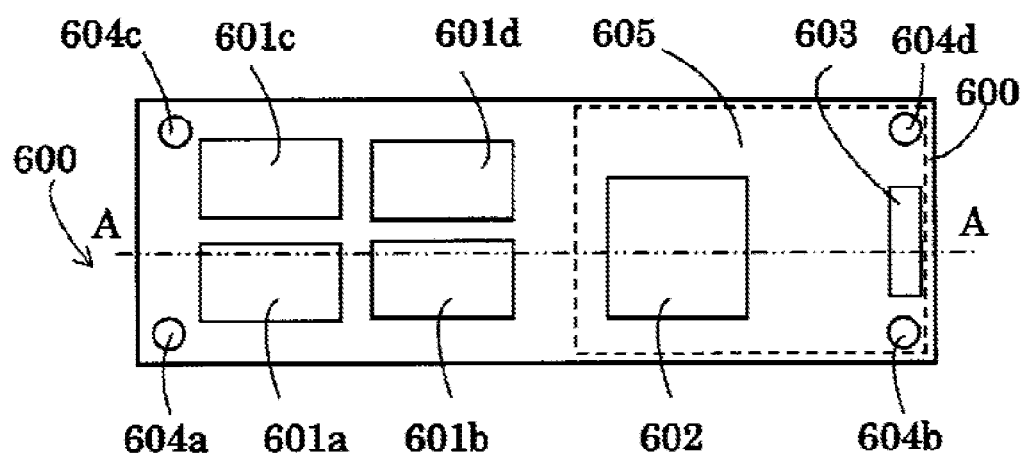
FIG. 6A is a planar view illustrating a semiconductor module according to a sixth embodiment.
Figure 6B:
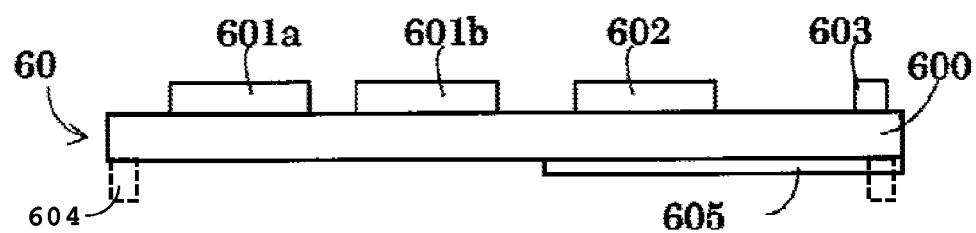
FIG. 6B is a cross-sectional view of the semiconductor module across line A-A in FIG. 6A.

FIG. 6A is a plan view illustrating a sixth semiconductor module 60 according to a sixth embodiment. FIG. 6B is a cross-sectional view of the sixth semiconductor module 60 across line A-A shown in FIG. 6A. The basic structure of the elements formed on a substrate 600 is the same as that of the second semiconductor module 20 according to the second embodiment. However, the shape of the metal plate formed on the back surface of the substrate 600 is different from that in the second embodiment.

As shown in FIGS. 6A and 6B, the sixth semiconductor module 60 has the following elements on the substrate 600: four NAND memories 601a-601d, a controller 602, a connector 603, and columns 604a-604d. The columns 604a-604d are formed at the mounting holes that are formed at the four corners of the substrate 600. In addition, the columns 604a-604d are attached on the substrate 600 so that they protrude downward from the back side of the substrate 600 (not shown in FIG. 6B and see FIG. 1). As the functions of the columns 604a-604d are basically the same as those of the first embodiment, detailed explanation of them will be omitted in this embodiment. The substrate 600 is, e.g., a printed circuit board with, e.g., a rectangular shape of 9 cm×4 cm.

A metal plate 605 is bonded to the back surface of the substrate 600 by an adhesive resin layer (not shown in the FIG. 6B). The material of the metal plate 605 is, for example, copper, and its thickness is, e.g., 0.1 cm. As shown in FIG. 6A, the metal plate 605 is shown by broken lines. This means that the metal plate 605 is bonded on the back surface of the substrate 600. As shown in FIG. 6B, the metal plate 605 may be superposed on the outer peripheral portion of the substrate 600.

The structure of the back surface of the substrate 600 in this embodiment is nearly the same as that of the structure in the second embodiment except that the metal plate 205a is not provided, and hence no metal plate surface underlies the NAND memory devices 601a-d.

In the structure of the present embodiment, the heat generated by the controller 602 is conducted via the substrate 600 to the metal plate 605. Here, because the metal plate 605 is not formed below the NAND memories 601a-601d, the heat conducted by the metal plate 605 to the area below the NAND memories 601a-601d is significantly reduced. Heat conducted to the metal plate 605 is conducted to the back side of the connector 603 and the columns 604b and 604d, and the heat is dissipated to the outside via the connector 603 and the columns 604b and 604d.

According to the above-mentioned conduction of heat, the heat conduction in the sixth semiconductor module can be maintained in a direction away from the NAND memory devices 601a-d when the module is in operation. As a result, it is possible to prevent error in the operation of the NAND memories 601a-601d, which will be caused by the heat generated by the controller 602.

(Seventh Embodiment)

Figure 7A:
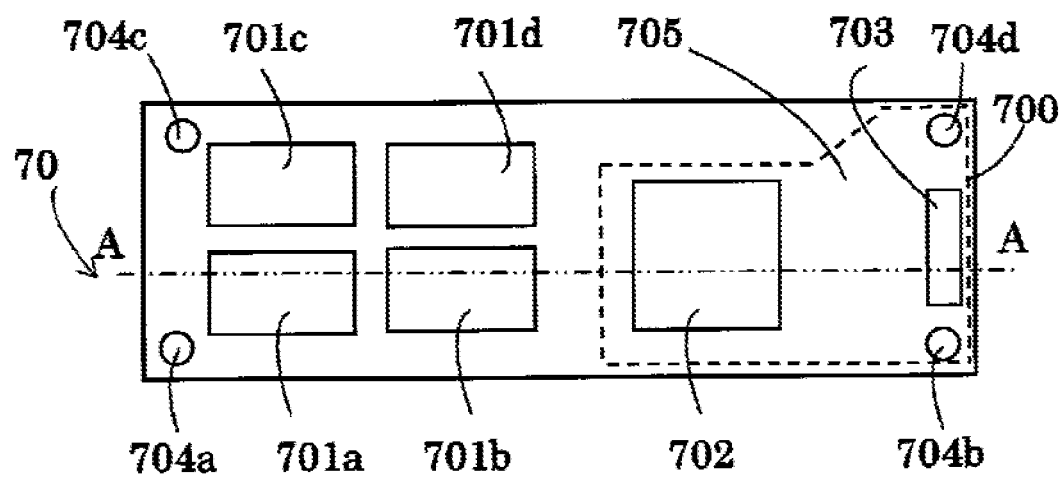
FIG. 7A is a planar view illustrating a semiconductor module according to a seventh embodiment.
Figure 7B:
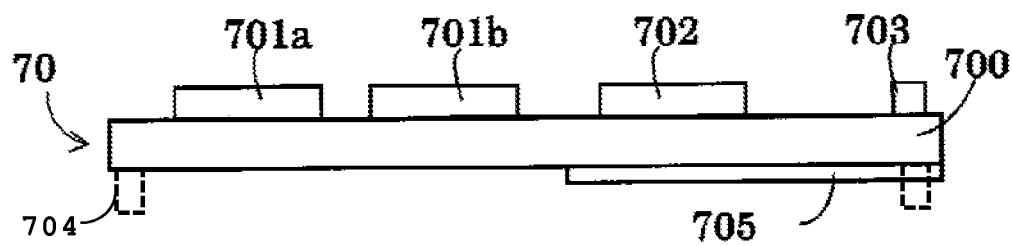
FIG. 7B is a cross-sectional view of the semiconductor module across line A-A in FIG. 7A.

FIG. 7A is a plan view illustrating a seventh semiconductor module 70 according to a seventh embodiment. FIG. 7B is a cross-sectional view of the seventh semiconductor module 70 across line A-A shown in FIG. 7A. The basic structure of the elements formed on a substrate 700 is the same as that of the sixth semiconductor module 60 according to the sixth embodiment. However, the shape of the metal plate formed on the back surface of the substrate 700 is different from that in the sixth embodiment.

As shown in FIGS. 7A and 7B, the seventh semiconductor module 70 has the following elements on the substrate 700: four NAND memories 701a-701d, a controller 702, a connector 703, and columns 704a-704d. The columns 704a-704d are formed at the mounting holes that are formed at the four corners of the substrate 700. In addition, the columns 704a-704d are attached on the substrate 700 so that they protrude downward from the back side of the substrate 700 (not shown in FIG. 7B and see FIG. 1). As the functions of the columns 704a-704d are basically the same as those of the first embodiment, detailed explanation of them will be omitted in this embodiment. The substrate 700 is, e.g., a printed circuit board with, e.g., a rectangular shape of 9 cm×4 cm.

A metal plate 705 is bonded to the back surface of the substrate 700 by an adhesive resin layer (not shown in FIG. 7B). The material of the metal plate 705 is, for example, copper, and its thickness is, e.g., 0.1 cm. As shown in FIG. 7A, the metal plate 705 is represented by broken lines, showing the position of the features of the metal plate 705 with respect to the devices on the front side of the substrate 700. In addition, in order to show the outline of the metal plate by the broken lines in FIG. 7A as well as FIGS. 2B to 6B, the lines are shown shifted a little to the inner side of the outer periphery of the substrate in each figure. However, the metal plate 705 may extend to the outer peripheral portion of the substrate 700.

The structure of the back surface of the substrate 700 in this embodiment is nearly the same as that of the structure in the sixth embodiment except that a portion of the metal plate 605 is, in the corner of the rectangular profile thereof, removed. In the structure of the present embodiment, the heat generated by the controller 702 is conducted via the substrate 700 to the metal plate 705. Here, because the metal plate 705 is not formed below the NAND memories 701a-701d, the heat conducted by the metal plate 605 to the area below the NAND memories 601a-601d is significantly reduced. Heat conducted to the metal plate 705 is conducted to the back side of the connector 703 and the columns 704b and 704d, and the heat is dissipated to the outside via the connector 703 and the columns 704b and 704d. In this case, the metal plate 705 has an oblique shape, i.e. has a cutout portion, so that the heat conducted to the metal plate 705 from the controller 702 is significantly concentrated to the column 704d.

The heat generated by the controller 702 in the seventh semiconductor module can be caused to flow away from the NAND memory devices when the module is in operation. As a result, it is possible to prevent error in the operation of the NAND memories 701a-701d, which will be caused by the heat generated by the controller 702.

(Eighth Embodiment)

Figure 8A:
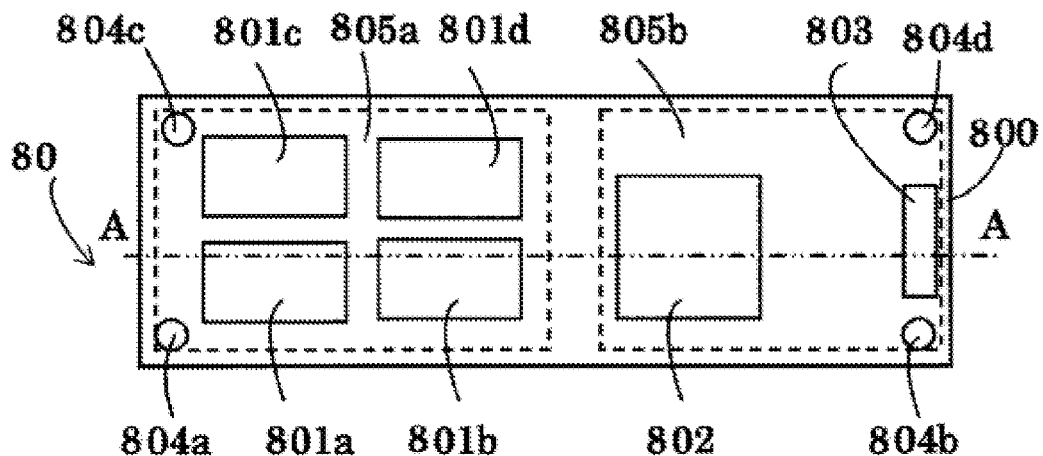
FIG. 8A is a planar view illustrating a semiconductor module according to an eighth embodiment.
Figure 8B:
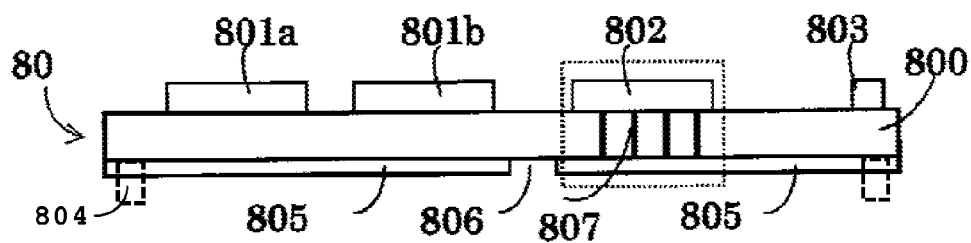
FIG. 8B is a cross-sectional view of the semiconductor module across line A-A in FIG. 8A
Figure 8C:
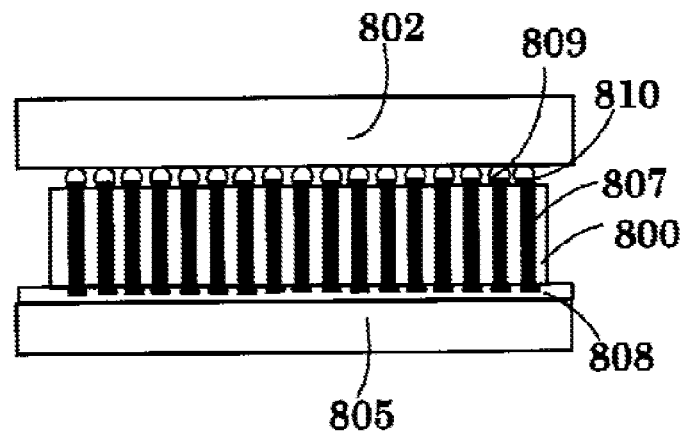
FIG. 8C is an enlarged cross-sectional view illustrating the portion of the semiconductor module defined by broken lines shown in FIG. 8B.

FIG. 8A is a plan view illustrating an eighth semiconductor module 80 according to an eighth embodiment. FIG. 8B is a cross-sectional view of the eighth semiconductor module 80 across line A-A shown in FIG. 8A. FIG. 8C is an enlarged cross-sectional view illustrating the portion of the eighth semiconductor module 80 defined by broken lines shown in FIG. 8B. The basic structure of the elements formed on a substrate 800 and the shape of a metal plate 805, which is bonded to the back surface of the substrate 800 by an adhesive layer 808 (shown in FIG. 8C), are the same as those of the third semiconductor module 30 according to the third embodiment. Further, as shown in FIG. 8C, the adhesive layer 808 bonds the substrate 800 and the metal plate 805.

The present embodiment is different from the third embodiment with respect to a plurality of thermal vias 807 being formed in the substrate 800. The same elements as those in the third embodiment will be omitted. In the following, the thermal vias 807 will be explained.

The thermal vias 807 are formed in through-holes extending through the body of the substrate 800, and the thermal vias 807 are formed of an electroconductive material. BGA (conductive adhesive) balls 809 are formed on the back surface of a controller 802 and are connected to carrying pads 810 that are formed on the surface of the substrate 800. Thus, the heat generated due to the operation of the controller 802 is conducted via the thermal vias 807 to the metal plate 805. As a result, more heat can be conducted to the metal plate 805.

Because the above-mentioned structure is added to the structure of the third embodiment, the heat conduction in the eighth semiconductor module in a direction away from the NAND memory devices 801a-d is greater when the module is in operation. As a result, it is possible to prevent error in the operation of NAND memories 801a-801d, which will be caused by the heat generated at the controller 802.

As explained above with reference to the first through the eighth embodiments, a metal plate is bonded onto the back surface of the substrate. Further, the metal plate is formed so that the heat generated at the controller has a restricted flow path to the NAND memories as compared to a relatively unrestricted flow path of an external sink. Consequently, it is possible to prevent error in the operation of the NAND memories due to the heat generated at the controller (control section).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor module, comprising:
    a substrate, which has a first surface and a second surface opposite to the first surface, the second surface comprising a first portion, a second portion, and a third portion intermediate of the first and second portions;
    a controller device and a memory device disposed on the first surface of the substrate, the controller device disposed opposite to the first portion and the memory device disposed opposite to the second portion; and
    a metal plate disposed on the second surface of the substrate, wherein the metal plate is disposed at least on the first portion of the second surface corresponding to a position of the controller device thereover, wherein the third portion of the second surface, wherein
    the metal plate is disposed on the second portion,
    the metal plate comprises a continuous plate, and
    a space provided in an uncovered portion of the third portion is a void extending through the metal plate.

2. The semiconductor module according to claim 1, wherein
    the substrate has a plurality of through holes for attaching columns that extend from the substrate; and
    further comprising a connector to input and output signals from a periphery of the semiconductor module.

3. The semiconductor module according to claim 2, wherein
    the metal plate is disposed at a fourth portion of the second surface corresponding to an overlying position of the columns and at a fifth portion of the second surface corresponding to an overlying position of the connector.

4. A semiconductor module, comprising:
    a substrate, which has a first surface and a second surface opposite to the first surface:
    a controller device and a memory device disposed on the first surface of the substrate; and
    a metal plate disposed on the second surface of the substrate, wherein the metal plate is disposed at least at a first portion of the second surface corresponding to a position of controller device thereover on the first surface so that heat generated at the controller device is conducted away from the memory device, wherein the metal plate is disposed at a second portion of the second surface corresponding to a position of the memory device on the first surface, the metal plate on the first portion and the second portion comprises a single metal plate, and a void is formed through the metal plate at a third portion of the second surface that is between the first and second portions.

\* \* \* \* \*